(12) United States Patent
Huang et al.

(10) Patent No.: US 11,772,134 B2
(45) Date of Patent: Oct. 3, 2023

(54) SONIC CLEANING OF BRUSH

(71) Applicant: Taiwan Semiconductor Manufacturing Company, Ltd., Hsinchu (TW)

(72) Inventors: Han-Yeou Huang, Zhudong Township (TW); Chun-Hsiang Fan, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 20 days.

(21) Appl. No.: 15/887,521

(22) Filed: Feb. 2, 2018

(65) Prior Publication Data
US 2019/0099787 A1    Apr. 4, 2019

Related U.S. Application Data

(60) Provisional application No. 62/565,693, filed on Sep. 29, 2017.

(51) Int. Cl.
| | |
|---|---|
| B08B 3/12 | (2006.01) |
| B08B 3/04 | (2006.01) |
| B08B 3/08 | (2006.01) |
| B08B 3/02 | (2006.01) |
| B08B 1/04 | (2006.01) |
| B08B 1/00 | (2006.01) |
| H01L 21/67 | (2006.01) |
| B08B 3/10 | (2006.01) |
| A46B 17/06 | (2006.01) |

(52) U.S. Cl.
CPC ............... *B08B 3/12* (2013.01); *A46B 17/06* (2013.01); *B08B 1/007* (2013.01); *B08B 1/04* (2013.01); *B08B 3/022* (2013.01); *B08B 3/044* (2013.01); *B08B 3/08* (2013.01); *B08B 3/10* (2013.01); *H01L 21/67046* (2013.01); *H01L 21/67051* (2013.01); *B08B 1/002* (2013.01)

(58) Field of Classification Search
CPC .... B08B 3/12; B08B 3/10; B08B 1/04; B08B 1/007; B08B 3/022; B08B 3/08; B08B 3/044; B08B 1/002; A46B 17/06; H01L 21/67046
USPC ........ 134/902, 1, 1.3, 26, 102.1, 102.2, 184, 134/34, 153, 17, 86
See application file for complete search history.

(56) References Cited

U.S. PATENT DOCUMENTS

| | | | | |
|---|---|---|---|---|
| 4,836,684 A | * | 6/1989 | Javorik | ..................... B08B 3/12 366/114 |
| 4,840,284 A | * | 6/1989 | Snyder | ............... B65D 77/0466 220/601 |
| 4,870,982 A | * | 10/1989 | Liu | ......................... A47L 25/00 134/135 |
| 5,379,785 A | * | 1/1995 | Ohmori | ............. H01L 21/67057 134/184 |

(Continued)

*Primary Examiner* — Duy Vu N Deo
*Assistant Examiner* — Christopher Remavege
(74) *Attorney, Agent, or Firm* — Slater Matsil, LLP

(57) ABSTRACT

A method includes cleaning a wafer with a brush element where the brush element collects particles from the wafer during the cleaning process. The brush element is immersed in a first cleaning liquid. An ultrasonic or megasonic vibration is applied to the first cleaning liquid. The ultrasonic or megasonic vibration causes the particles to dislodge from the brush element into the first cleaning liquid. The particles contaminate the first cleaning liquid.

20 Claims, 13 Drawing Sheets

(56) References Cited

U.S. PATENT DOCUMENTS

| | | | | |
|---|---|---|---|---|
| 5,693,148 A * | 12/1997 | Simmons | ............... | A46B 17/04 134/1.3 |
| 5,813,074 A * | 9/1998 | Liljeholm | ................. | B08B 3/12 134/1 |
| 6,047,846 A * | 4/2000 | Watson | .................... | B65D 1/16 220/601 |
| 6,058,544 A * | 5/2000 | Motoda | .................... | B08B 1/04 15/77 |
| 6,098,643 A * | 8/2000 | Miranda | .................. | B08B 3/12 134/186 |
| 6,651,284 B2 * | 11/2003 | Tseng | ...................... | B08B 1/007 134/104.1 |
| 7,955,557 B2 * | 6/2011 | Watari | ................. | G01N 35/025 422/68.1 |
| 8,863,763 B1 * | 10/2014 | Chen | ........................ | B08B 3/12 134/111 |
| 9,610,615 B2 * | 4/2017 | Tien | ........................ | B24B 37/20 |
| 2003/0201000 A1 * | 10/2003 | Worm | ............... | H01L 21/67051 134/32 |
| 2004/0050408 A1 * | 3/2004 | Christenson | ............ | B08B 3/048 134/184 |
| 2005/0017599 A1 * | 1/2005 | Puskas | .................. | B06B 1/0622 310/317 |
| 2005/0122003 A1 * | 6/2005 | Goodson | .................... | B08B 3/12 310/334 |
| 2007/0251035 A1 * | 11/2007 | Peng | ...................... | A46B 17/06 15/77 |
| 2011/0265816 A1 * | 11/2011 | Chen | ................. | H01L 21/67046 134/6 |
| 2014/0102493 A1 * | 4/2014 | Kuo | ........................ | B08B 3/12 134/184 |
| 2014/0261537 A1 * | 9/2014 | Chang | .................... | B08B 1/007 134/6 |
| 2015/0027489 A1 * | 1/2015 | Lyu | .................... | H01L 21/67051 134/1 |
| 2015/0258583 A1 * | 9/2015 | Korbler | ................. | B06B 1/0607 367/155 |
| 2016/0001333 A1 * | 1/2016 | Jones | .................... | B06B 1/0284 134/1 |
| 2016/0254170 A1 * | 9/2016 | Hu | .................... | H01L 21/67046 134/1.3 |
| 2017/0250096 A1 * | 8/2017 | Wang | ....................... | B08B 1/04 |

* cited by examiner

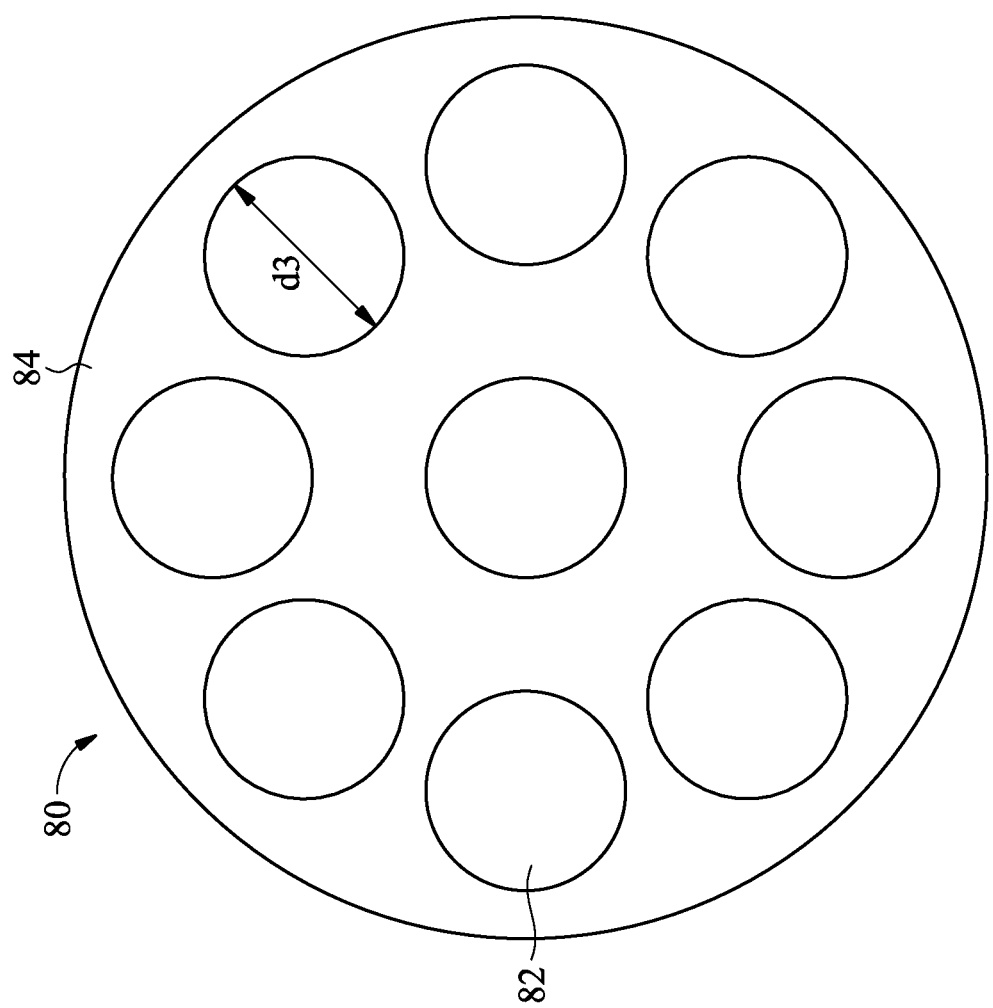

SONIC CLEANING OF BRUSH

PRIORITY CLAIM AND CROSS-REFERENCE

This application claims the benefit of U.S. Provisional Application No. 62/565,693, filed on Sep. 29, 2017, which application is hereby incorporated herein by reference.

BACKGROUND

Semiconductor fabrication includes processes which create organic and inorganic particulate byproducts which may contaminate or cross-contaminate further wafer processing. Cleaning such particulate matter is important to provide greater-yield and reduce defects associated with such particulate matter. Due to commonly elevated temperatures in processing environments, these particles can adhere strongly to the back side of wafers. Particles on the back side of wafers can interfere with further fabrication processes such as photolithography (causing focusing defects), die tape mounting, bonding, and so forth.

Front side and back side wafer processing may produce several types of particulate matter that may adhere to the back side of wafers. Particles can be generated during numerous processes such as gate replacement, dry etching, carrier detachment, dielectric deposition, metal sputtering, implant processes, or ashing, and so forth. Cross-contamination of particles may occur from wafer handling with either an electrostatic or vacuum chuck, resulting in defect maps. Particles can include both particulate and ionic contaminants.

Cleaning processes vary and typically include some sort of liquid cleaning agent. Mechanical force can also be used, such as with a cleaning brush or sponge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6a through 6c illustrate different aspects of a sonic transducer, in accordance with some embodiments.

DETAILED DESCRIPTION

Figure 1A:
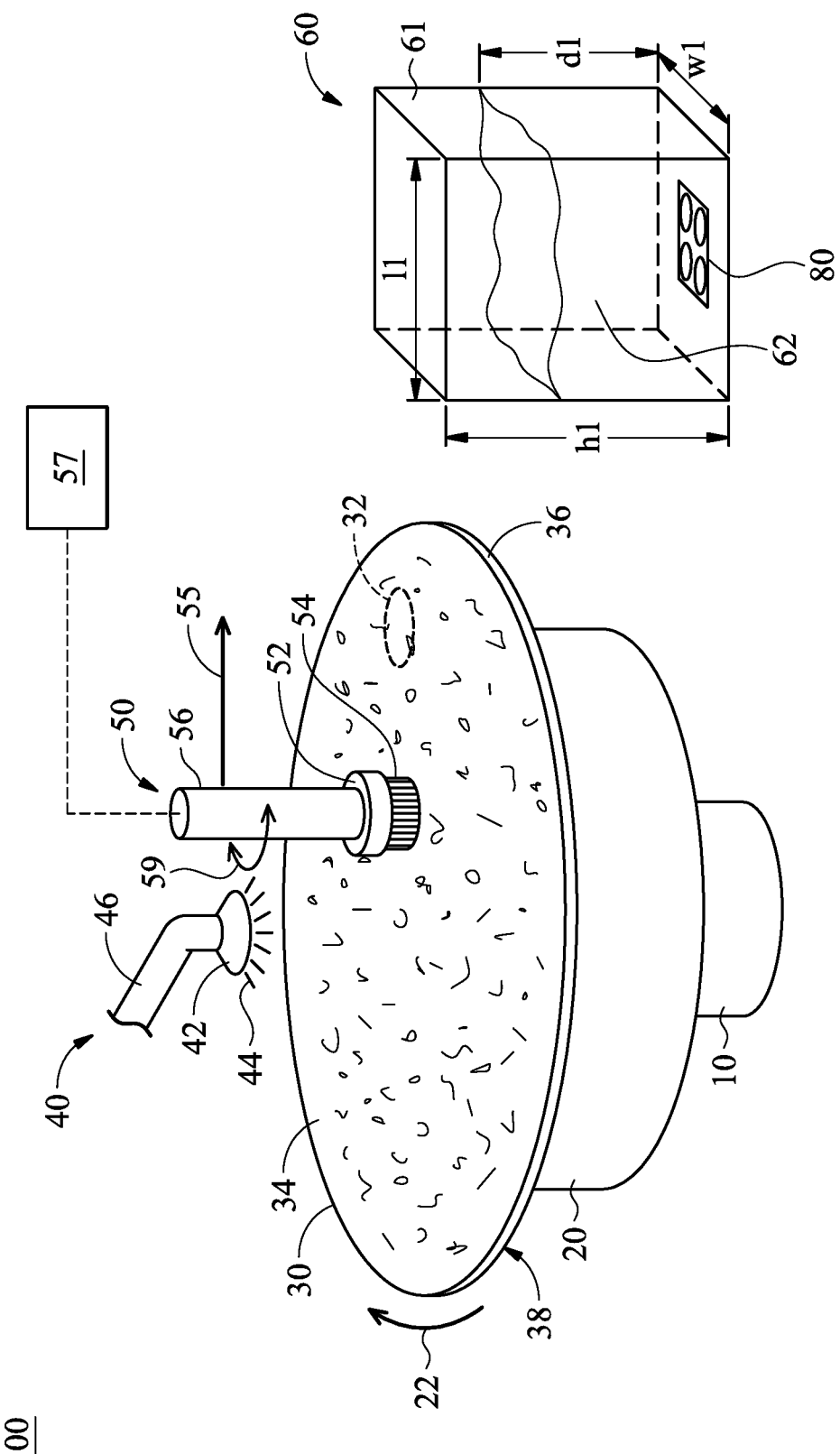
FIGS. 1a through 4 illustrate intermediate steps in a process of sonically cleaning a brush, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In back side wafer processing, a cleaning brush or sponge can be used in conjunction with a liquid cleaning solution to remove contaminants from the back side of the wafer. Back side contaminants can interfere with further wafer processing, including front side processing. For example, back side contaminants may be transferred to the front side of the wafer through wafer handling. Also, back side contaminants can interfere with the position of a wafer on a vacuum or electrostatic chuck, causing focus defects in photolithography processes. Therefore, it is desirable to clean the back side of the wafer from these back side contaminants. Due to the typically elevated temperatures used in wafer processing and device fabrication, contaminants can adhere strongly to the back side surface of the wafer so that it may be desirable to use mechanical force to forcibly dislodge and remove the contaminants. A cleaning brush or sponge may be used to mechanically clean the back side of the wafer. A liquid cleaning solution can be applied to the back side surface of the wafer while the wafer is rotated and a cleaning brush or sponge can be dragged across the back side surface of the wafer. Contaminants may be swept off the wafer and into a collection cup positioned beneath the wafer. In the process of cleaning, the cleaning brush or sponge may pick up contaminants and adhere to the cleaning brush or sponge. The contaminants can reduce the effectiveness and longevity of the cleaning brush or sponge.

Embodiments clean the cleaning brush or sponge to remove or reduce contaminants adhering to the brush or sponge. Cleaning may include immersing the brush or sponge in a liquid cleaning solution bath. In some embodiments, cleaning may include a sonic cleaning process which vibrates the liquid to dislodge particles collecting on the brush or sponge. Sonically cleaning the brush increases longevity of the brush, at least doubling the life of the brush, and provides less opportunity for cross-contamination.

FIGS. 1a through 4 illustrate intermediate steps of the cleaning of the back side of a wafer and cleaning of a cleaning brush, in accordance with some embodiments. Although the cleaning of the back side of a wafer is discussed with reference to Figures below, embodiments consistent with those discussed herein may also be used to clean a cleaning brush or sponge following the cleaning of the front side of the wafer, for example, after a chemical mechanical polishing (CMP) process.

FIG. 1a illustrates a cleaning process of the surface of a wafer 30. The wafer cleaning system 100 includes a wafer platform 20 for holding a wafer 30. A base member 10 may support wafer platform 20 and be coupled to a rotating mechanism (not shown) for rotating base member 10 and consequently wafer platform 20 and wafer 30. A cup (not shown) may be positioned below and around wafer platform 20 and/or wafer 30 to catch cleaning liquid and contaminants from the wafer cleaning process. The arrow 22 illustrates a rotational ability of wafer 30 due to the rotating of wafer platform 20. In some embodiments, wafer platform 20 may rotate by a means other than base member 10. In some embodiments, wafer 30 may rotate in either or both rotational directions.

Wafer 30 includes a wafer surface 34, wafer edge 36, and wafer surface 38. Wafer surface 34 may be the back side of wafer 30 and wafer surface 38 may be the front side of wafer 30. In some embodiments, wafer surface 34 may be the front side of wafer 30 and wafer surface 38 may be the back side of wafer 30. In some other embodiments, wafer 30 may be suspended rather than supported by the wafer platform 20, such that the exposed wafer surface 34 is facing downward.

Semiconductor fabrication includes processes which create organic and inorganic byproducts which may contaminate or cross-contaminate further wafer processing. Front side and back side wafer processing may produce several types of contaminants, such as particles 32, which may adhere to the wafers. Such contaminants can be generated during numerous processes such as gate replacement, dry etching, carrier detachment, dielectric deposition, metal sputtering, implant processes, or ashing, and so forth.

Particles 32 are disposed on the wafer surface 34 to be cleaned. Particles 32 include any contaminants which may result from wafer processing, such as organic, inorganic, or metallic particulate or ionic contaminants. Particles 32 may be sitting loosely on wafer surface 34 or may be adhered thereto.

A spray head 40 is suspended over wafer 30 to provide a cleaning liquid 44 to wafer surface 34. The spray head 40 may include a spray outlet nozzle 42 to spray cleaning liquid 44 in a fan pattern so as to cover the entirety of wafer surface 34. In some embodiments, a spray head 40 having multiple spray outlet nozzles 42 may be provided. In some embodiments, spray heads 40 may be fixed over the wafer surface 34. In other embodiments, spray heads 40 may be movable over the wafer surface 34 to ensure coverage of the cleaning liquid 44 over the wafer surface 34. In some embodiments, the cleaning process may provide a volume of liquid at about 300 ml/s to about 1000 ml/s, such as about 700 ml/s. In some embodiments, the cleaning process may provide pressurized liquid at a force of about 0.1 N/mm$^2$ to about 2 N/mm$^2$, such as about 1 N/mm$^2$.

Cleaning liquid 44 includes various types of cleaning liquids and solutions and may also be referred to as cleaning solution 44. Different types of cleaning solution 44 may be used to clean different residues (i.e., contaminants) on wafers. In some embodiments, cleaning liquid 44 includes water with no chemicals intentionally added. Cleaning liquid 44 may also be deionized water. In some embodiments, cleaning solution 44 includes an acid aqueous solution, which may include an organic acid such as citric acid, an inorganic acid such as $HNO_3$, or the like. In some embodiments, cleaning solution 44 includes an alkaline aqueous solution, which may include an organic base such as $NR_3$ (with R being alkyl), an inorganic base such as $NH_4OH$, or the like. Surfactants such as sodium dodecyl sulfate may be added into cleaning solution 44 to reduce the surface tension of cleaning solution 44. Cleaning solution 44 may include water as a solvent. Alternatively, cleaning solution 44 may use organic solvents such as methanol. Cleaning solution 44 may also be an aqueous solution including peroxide. For example, cleaning solution 44 may include $H_2O_2$ in water.

Cleaning liquid 44 may not be heated, and hence may have a temperature based on an ambient temperature between about 15° C. and about 25° C. during the cleaning process. Cleaning liquid 44 may also be heated to a temperature in a range between about 25° C. and about 80° C., such as about 40° C. With the increased temperature, the efficiency of the cleaning may be improved. A temperature higher than about 80° C. or lower than about 15° C. may also be used.

Still referring to FIG. 1a, one or more cleaning brushes 50 are provided over the wafer 30, which may also be referred to as brush 50. Representative brush 50 includes a movable member 56 for positioning cleaning brush 50 over parts of wafer 30. In some embodiments, multiple ones of cleaning brush 50 may be used. Movable member 56 may be attached to an arm (shown in FIG. 1b) that controls the lateral and vertical positions of the cleaning brush 50. In some embodiments, the arm may be articulated such that cleaning brush 50 can be positioned over wafer 30 at any point, as indicated by arrow 55. Cleaning brush 50 may have a brush holder 52 for holding the brush element 54. In some embodiments, cleaning brush 50 may have a cleaning liquid outlet (not shown) and cleaning liquid, such as cleaning liquid 44, may be dispensed from the cleaning liquid outlet. In some embodiments, brush element 54 may be formed of polyvinyl alcohol (PVA), resin, polypropylene, or other suitable materials. Brush element 54 may have a form of bristles or sponges. A lateral dimension, such as a diameter or width, of the cleaning surface of brush element 54 may be between about 10 and 50 mm, such as about 20 mm. A total surface area of the cleaning surface of brush element 54 may be between about 70 mm$^2$ and 400 mm$^2$, such as about 300 mm$^2$.

In some embodiments the one or more cleaning brushes 50 may include multiple brushes which may be controlled individually, as a group unit, or as multiple groups of two or more brushes. The multiple brushes may be arranged in an array or in any suitable pattern. The multiple brushes may each be the same size as each other or different sizes, depending on their desired usage and configuration.

Brush 50 may have a cylindrical shape with a circular cross-section. In some embodiments, brush 50 may be configured to rotate, as indicated by arrow 59. In some embodiments, brush holder 52 may be configured to rotate, which in turn rotates brush element 54. In some embodiments, movable member 56 may be configured to rotate, thereby rotating brush holder 52 and in turn rotating brush element 54. In some embodiments, brush 50 may be rotated (arrow 59) in the same direction as wafer 30. In some embodiments, brush 50 may be rotated in a direction counter to the direction of rotation of wafer 30. In some embodiments, brush 50 may be rotated back and forth in alternating directions. Brush 50 may be rotated and moved (arrow 55) by means of one of driving components 57. The driving components 57 may include, for example, motors, gliding guides, robot arms, gears, and the like. Driving components 57 are configured to rotate and/or move/swing and/or raise/lower movable member 56 and brush element 54. Accordingly, with the operation of the driving components 57, brush element 54 may be rotated and/or swung and/or raised/lowered, as will be discussed in detail in subsequent discussion.

A cleaning vessel 60 may be positioned near the wafer cleaning apparatus. The cleaning vessel includes a tank 61 containing a cleaning liquid 62. Cleaning liquid 62 may be selected from the cleaning liquids discussed above with respect to cleaning liquid 44. Cleaning liquid 62 may be the same or different than cleaning liquid 44. Tank 61 may have a shape similar to that of a rectangular prism, having dimensions length l1, width w1, and height h1, where the length l1 is between about 5 and 10 cm, such as about 8 cm, the width w1 is between about 5 and 10 cm, such as about 8 cm, and the height h1 is between about 8 and 15 cm, such as about 12 cm. Other dimensions may be used as well. Also, in some embodiments, the shape of tank 61 may be different (see, e.g., FIGS. 8-10). The total volumetric capacity of the tank may be between about 0.2 L and 1.5 L, such as about 0.6 L. The amount of cleaning liquid 62 in tank 61 may be between about 0.16 L and 1.2 L, such as about 0.4 L. Cleaning liquid 62 may fill the tank to a depth d1 between about 6 cm and 12 cm, such as about 8 cm. Other values for the capacity of tank 61, amount of cleaning liquid 62, and depth of cleaning liquid 62 may be used as desired. A transducer device 80 may be positioned in tank 61 in cleaning liquid 62 or positioned external to tank 61. When activated, transducer device 80 may vibrate, which in turn vibrates cleaning liquid 62. Cleaning vessel 60 and transducer device 80 will be described in more detail in connection with FIGS. 5 through 9. The vibratory action of transducer device 80 can create ultrasonic or megasonic agitation of cleaning liquid 62 and produce a cavitation effect within cleaning liquid 62.

Still referring to FIG. 1a, the cleaning process of wafer 30 commences by spraying cleaning liquid 44 onto wafer surface 34 while wafer 30 is rotated (arrow 22). Some of particles 32 may come off wafer 30 during the spraying action. Cleaning liquid 44 and some of particles 32 may spill over the wafer edge 36 and into a collecting cup (not shown) for disposal or further processing. In the spraying process, pressurized spray of cleaning liquid 44 may be used. In some embodiments, spray outlet nozzle 42 may rotate to direct cleaning liquid 44 to particular areas of wafer 30.

In the wafer cleaning process, brush 50 may be positioned on wafer 30 and swung (as indicated by arrow 55) from the middle of wafer 30 toward the outside of wafer 30. In some embodiments, brush 50 may be swung from one edge of wafer 30 to the other edge of wafer 30. During the cleaning process, wafer 30 is rotated, for example, as illustrated by arrow 22. Brush 50 may also be rotated as illustrated by arrow 59 with respective to its own axis. The axis of brush 50 may be in the lengthwise direction of the brush, and perpendicular to the surface of wafer 30. In accordance with some embodiments, movable member 56 has space therein to transport cleaning liquid 44 to the brush element 54 and dispense cleaning liquid 44 onto brush element 54 and onto materials surrounding brush element 54, such as the surface of wafer 30.

As brush 50 is moved over the surface of wafer 30, downward pressure may be applied on brush 50 to apply force to wafer surface 34 by brush element 54. In some embodiments, multiple passes of brush 50 may be made over wafer surface 34. In between passes, cleaning liquid 44 dispensed from spray outlet nozzle 42 may continue to wash particles 32 from wafer surface 34. As brush 50 is moved over wafer surface 34, some of particles 32 collect on brush element 54.

Figure 1B:
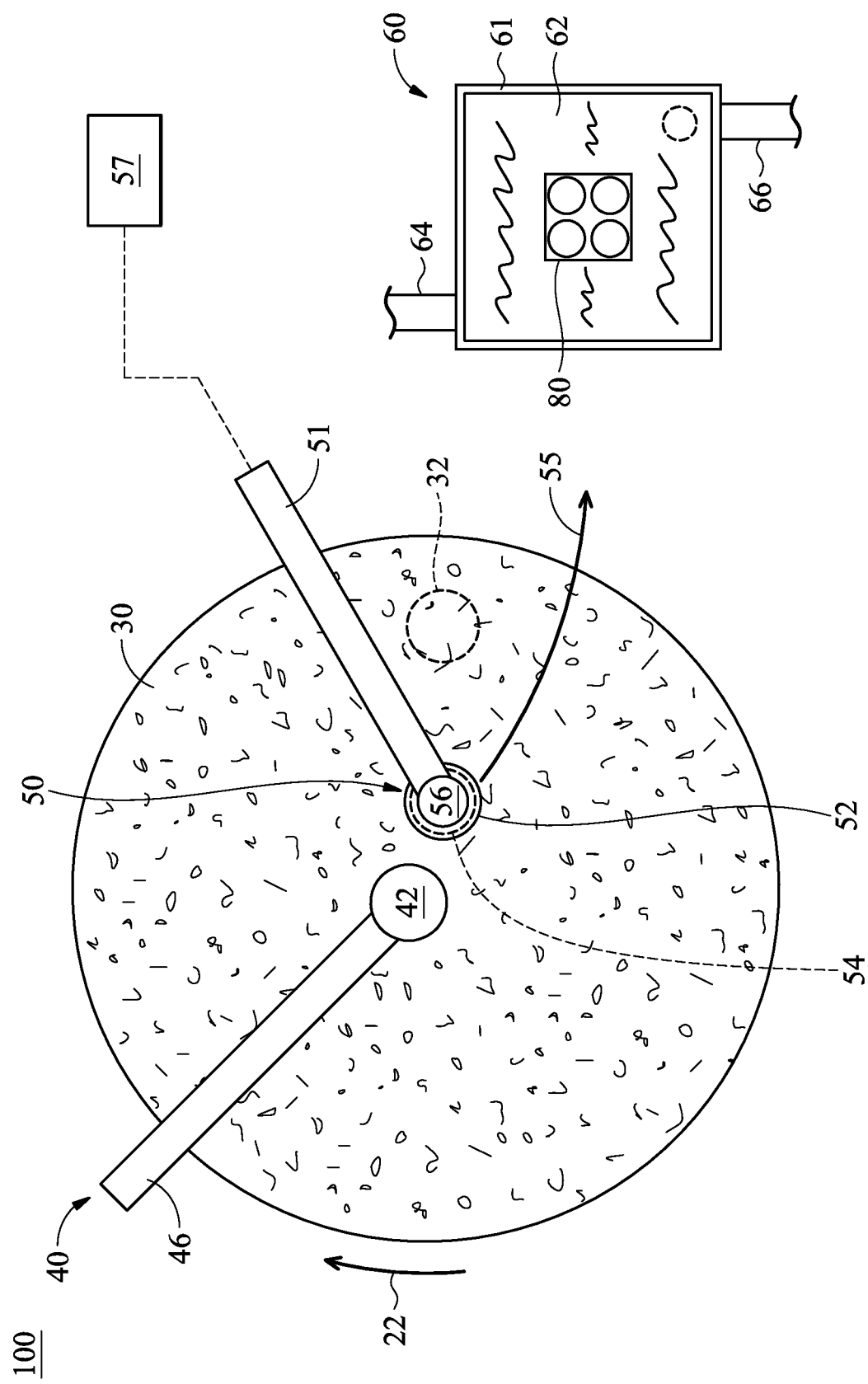

Referring to FIG. 1b, a top down view of the wafer cleaning system 100 is illustrated, in accordance with some embodiments. Wafer 30 is illustrated which contains particles 32. Spray head 40 includes an arm 46 and spray outlet nozzle 42 which sprays a cleaning liquid (such as cleaning liquid 44, described above) onto the wafer 30. Wafer 30 can be rotated (arrow 22) as described above. Brush 50 includes movable member 56, brush holder 52, and brush element 54 (shown in phantom). Movable member 56 is coupled to brush arm 51 which can be used to position brush 50 over wafer 30. Brush arm 51 may perform a sweeping motion (indicated by arrow 55) by moving brush 50 across wafer 30. In some embodiments, brush arm 51 may be articulated to bend between a base end of brush arm 51 and distal end of brush arm 51. An articulated brush arm 51 may position movable member 56 over more parts of wafer surface 34 than an arm that provides a sweeping motion (arrow 55) alone. In some embodiments, brush arm 51 may be able to position the moveable member 56 over any area of the wafer surface 34. Brush arm 51 may be moved using robotics and motors, represented by driving components 57. Cleaning vessel 60 includes a tank 61, inlet pipe 64, outlet pipe 66, transducer device 80, and cleaning liquid 62. These elements are described above which descriptions are not repeated. Cleaning vessel 60 may be positioned adjacent to the wafer 30. In some embodiments, cleaning vessel 60 may be positioned in the arc of the sweeping motion (arrow 55) of the brush 50 so that brush arm 51 can position the brush 50 over the tank 61 opening and lower the brush 50 into cleaning liquid 62 of cleaning vessel 60. Cleaning vessel 60 may include an inlet pipe 64 and outlet pipe 66, described in detail below with respect to FIG. 5.

Figure 2:
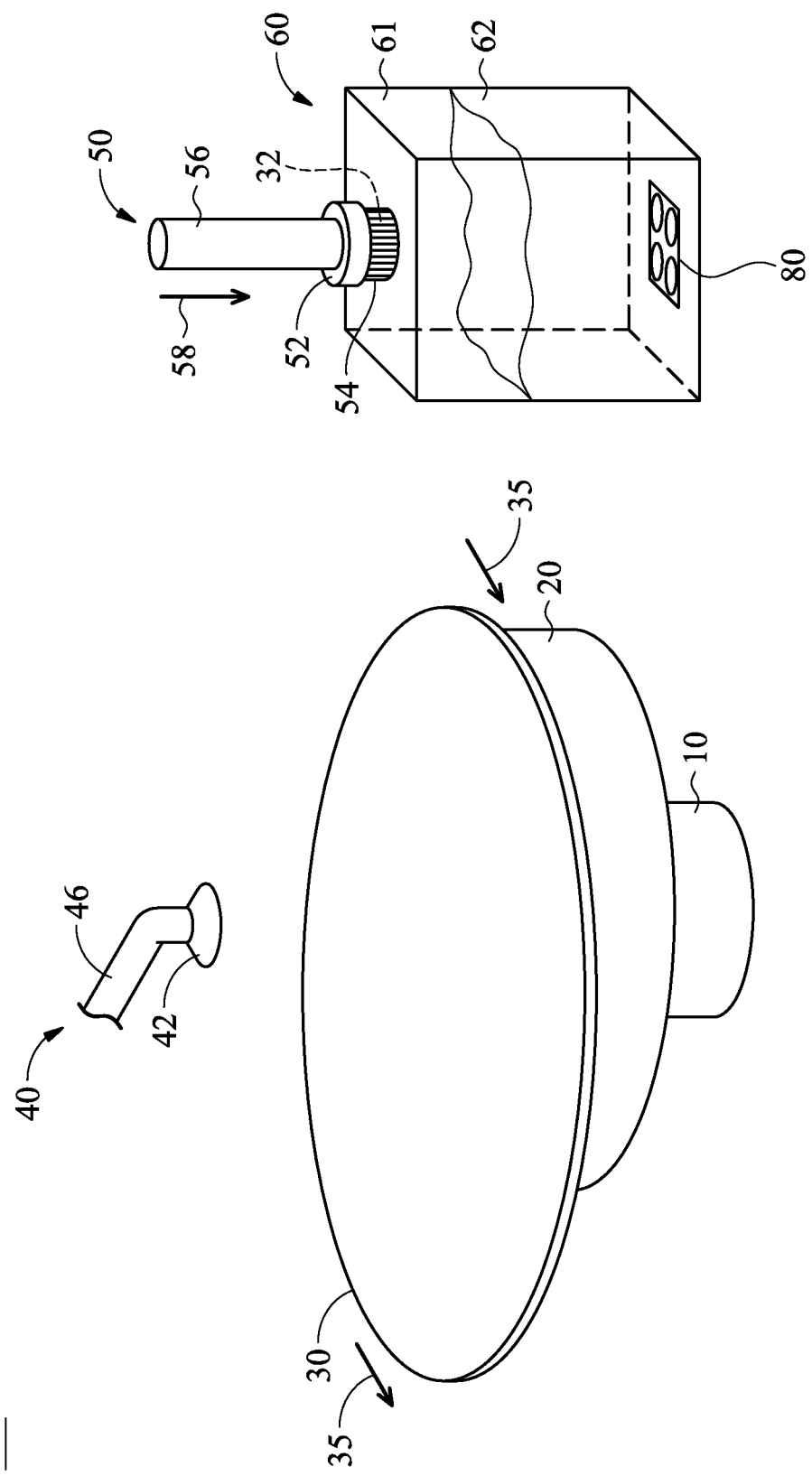

Referring to FIG. 2, following the cleaning of wafer 30 wafer surface 34 is substantially free of particles 32. Some of particles 32, however, have been transferred to brush element 54. Wafer 30 is removed after cleaning, as illustrated by arrows 35. While wafer 30 is removed and a new dirty wafer is loaded, brush 50 is moved to cleaning vessel 60 and lowered into cleaning vessel 60 as indicated by arrow 58. In some embodiments, multiple cleaning passes of brush 50 may be used over the same wafer in the cleaning of wafer 30. In such embodiments, brush 50 may be cleaned, such as described below, between two or more of the multiple cleaning passes without unloading wafer 30.

Figure 3:
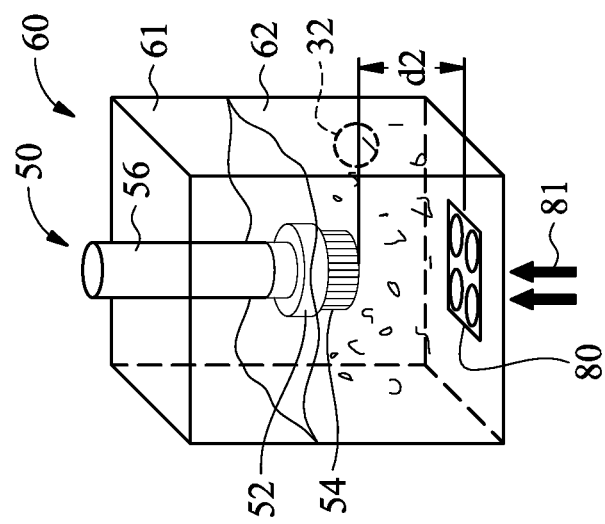
Figure 3:
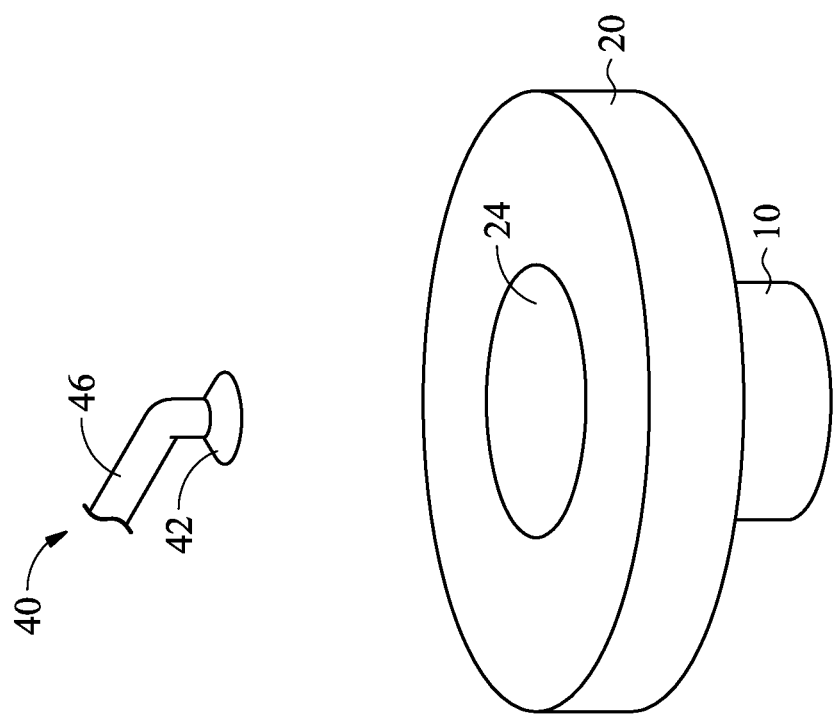

Referring now to FIG. 3, as wafer 30 is being unloaded and the next wafer to be cleaned loaded into the cleaning chamber of wafer cleaning system 100, brush element 54 of brush 50 is submerged in cleaning liquid 62 of cleaning vessel 60. Brush 50 may be submerged such that the entire brush element 54 is immersed in cleaning liquid 62. Brush element 54 may be positioned a distance d2 from transducer device 80. Distance d2 may be between about 10 mm and 80 mm, such as about 20 mm. Other distances may be used. Positioning brush element 54 apart from transducer device 80 allows for the cavitation effect of cleaning liquid 62 in the cleaning process to clean brush element 54. On the other hand, keeping brush element 54 close to transducer device 80 provides that the cavitation effect of cleaning liquid 62 does not become overly attenuated before the cavitation reaches brush element 54, which would reduce its effectiveness. In some embodiments, the distance d2 may be selected based on the output power of transducer device 80.

Transducer device 80 may be activated (indicated by arrows 81) to vibrate cleaning liquid 62, to produce a vibration wave. In some embodiments, transducer device 80 may vibrate in an ultrasonic range, for example, about 20 to about 300 kHz, such as about 100 kHz. In other embodiments, transducer device 80 may vibrate in a megasonic range, for example about 0.6 MHz to about 2 MHz, such as about 1 MHz. Other frequencies may be used depending on the design and selection of transducer device 80 used in cleaning vessel 60. Some embodiments may be able to vibrate across a variety of ranges. At the ultrasonic range, transducer device 80 may produce random cavitation in cleaning liquid 62. At the megasonic range, transducer device 80 may produce controlled cavitation in cleaning liquid 62.

As brush element 54 is submerged in cleaning liquid 62 and as it is subjected to the sonic cleaning process, particles 32 which are on brush element 54 are dislodged by the sonic cleaning process and fall off of brush element 54. Some particles 32 may be suspended in the cleaning liquid 62 due to the sonic cleaning process while some particles 32 may sink to the bottom of cleaning vessel 60. Without the sonic cleaning process, some particles 32 may come free from brush element 54, however, with the sonic cleaning process, a significantly greater number of particles 32 are freed from the brush element 54. In some embodiments, about 40% to about 90%, such as about 70%, more particles are freed from the brush element with the sonic cleaning process than without. In some embodiments, about 60% to about 99%, such as about 90%, of particles 32 are removed from brush element 54 as a result of the sonic cleaning process. The amount of particles removed depends on the sizes and types of particles 32 on brush element 54.

Wafer platform 20 is also illustrated in FIG. 3. Wafer platform 20 may include a holding mechanism 24 used to hold wafer 30 to the platform during the cleaning process. In some embodiments, holding mechanism 24 is a vacuum inlet, as when wafer platform 20 is part of a vacuum chuck. In some embodiments, holding mechanism 24 is a charge plate, as when wafer platform 20 is part of an electrostatic chuck.

Figure 4:
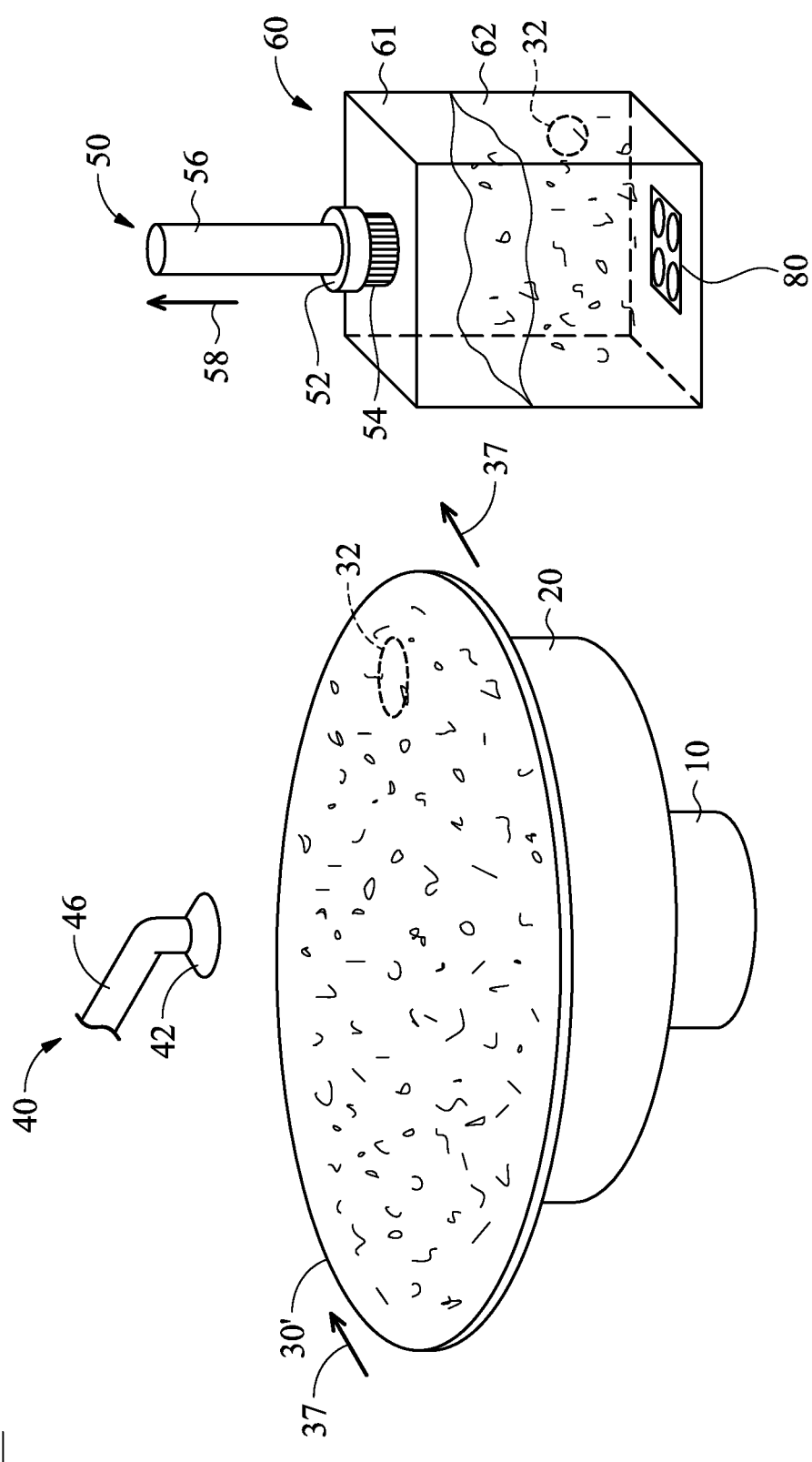

Referring to FIG. 4, following the sonic cleaning process, brush 50 is raised, removing brush element 54 from cleaning liquid 62. As brush 50 is cleaned, another wafer 30' to be processed is loaded into the cleaning chamber, as indicated by arrows 37. Wafer 30' has particles 32 disposed thereon, which are to be cleaned off in a subsequent cleaning process. After wafer 30' is loaded into the cleaning chamber, the cleaning process begins again, such as described above with respect to FIG. 1a, and proceeds from there.

In some embodiments, brush 50 may be sonically cleaned between the cleaning of each wafer 30, 30', and so on. In some embodiments, brush 50 may be sonically cleaned between a certain number of wafers cleaned. For example, brush 50 may be sonically cleaned between every 1 to 100 wafers, such as between every 5 wafers. Other values may be used. In some embodiments, brush 50 may be sonically cleaned at certain time intervals. For example, brush 50 may be sonically cleaned every 1 to 120 minutes, such as every 10 minutes. Other values may be used. The interval for sonically cleaning brush 50 may be dynamically adjusted as desired based on different applications and brush types.

The sonic cleaning process described herein can be combined with one or more other cleaning processes. For example, brush 50 may be rinsed first and then sonically cleaned. In another example, brush 50 may be rinsed between each wafer and sonically cleaned at a different interval. Rinsing, for example, may be performed by activating the spray outlet nozzle 42 while spray is directed toward brush 50 and especially brush element 54.

It should be noted that in some embodiments transducer device 80 may be activated before the brush element 54 is submerged in the cleaning liquid 62 and remain activated after the brush element 54 is removed from the cleaning liquid 62. For example, transducer device 80 may be activated as soon as the wafer 30 cleaning process is completed.

In some embodiments transducer device 80 may remain activated for the entire time the wafer cleaning operation is taking place.

In some embodiments, the timing of the sonic brush cleaning can be chosen to coincide with the time it takes to unload a cleaned wafer 30 and load a contaminated wafer 30' as the next wafer to be cleaned. For example, as soon as the wafer 30 has been cleaned, brush 50 may be moved to the cleaning vessel 60 and sonically cleaned. In the \*meantime, while brush 50 is being cleaned, wafer 30 is unloaded from wafer platform 20 and contaminated wafer 30' is loaded onto wafer platform 20. By the time system 100 is ready to clean wafer 30', brush 50 may be removed from the cleaning vessel 60 and put in position to clean wafer 30'. In some embodiments, the timing for unloading/loading and sonically cleaning brush 50 may be between about 6 and 20 seconds, for example, about 10 seconds. Brush element 54 may be cleaned between about 6 and 20 seconds, for example, about 10 seconds.

In some embodiments, the timing of the sonic brush cleaning may be selected based on other criteria, such as a desired cleaning time for the brush. A brush cleaning time may be between 5 seconds and 100 seconds, for example, about 60 seconds. If the wafer unload and load process is completed before the sonic brush cleaning is completed, the wafer cleaning system 100 may wait until brush 50 is in place before cleaning the next wafer, wafer 30'. In some embodiments, the wafer cleaning system 100 may activate the spray outlet nozzle 42 to dispense cleaning liquid 44 onto wafer 30' while waiting for brush 50 to become ready to clean wafer 30'. In some embodiments, different sonic brush cleaning techniques can be combined to provide sonic cleaning of brush 50 within the timeframe to unload and load a new wafer and then at certain intervals sonically clean brush 50 for a longer time to more thoroughly clean brush 50.

The temperature of cleaning liquid 62 in cleaning vessel 60 may be whatever the ambient temperature is, or in other words, neither cooled nor heated, and hence may have a temperature between about 15° C. and about 25° C. during the sonic cleaning process. In some other embodiments, cleaning liquid 62 may also be heated to a temperature in a range between about 25° C. and about 80° C., such as about 55° C. to about 65° C. With the increased temperature, the efficiency of the sonic cleaning process may be improved. A temperature higher than about 80° C. or lower than about 15° C. may also be used.

The sonic cleaning of brush 50 can provide better cleaning results than not cleaning brush 50 or than cleaning brush 50 with a different cleaning process. Because fewer particles 32 are stuck to brush element 54 from one wafer 30 while subsequently cleaning wafer 30', there is less opportunity for cross-contamination from one wafer to the next. Cleaning brush 50 using the sonic cleaner also increases the longevity of brush 50. For example, without sonic cleaning of brush 50, brush element 54 may need to be replaced after every 30,000 wafers cleaned. Cleaning brush 50 using the sonic cleaning system, however, allows brush element 54 to last at least twice as long, not needing to be replaced until at least 60,000 wafers have been cleaned.

Figure 5:
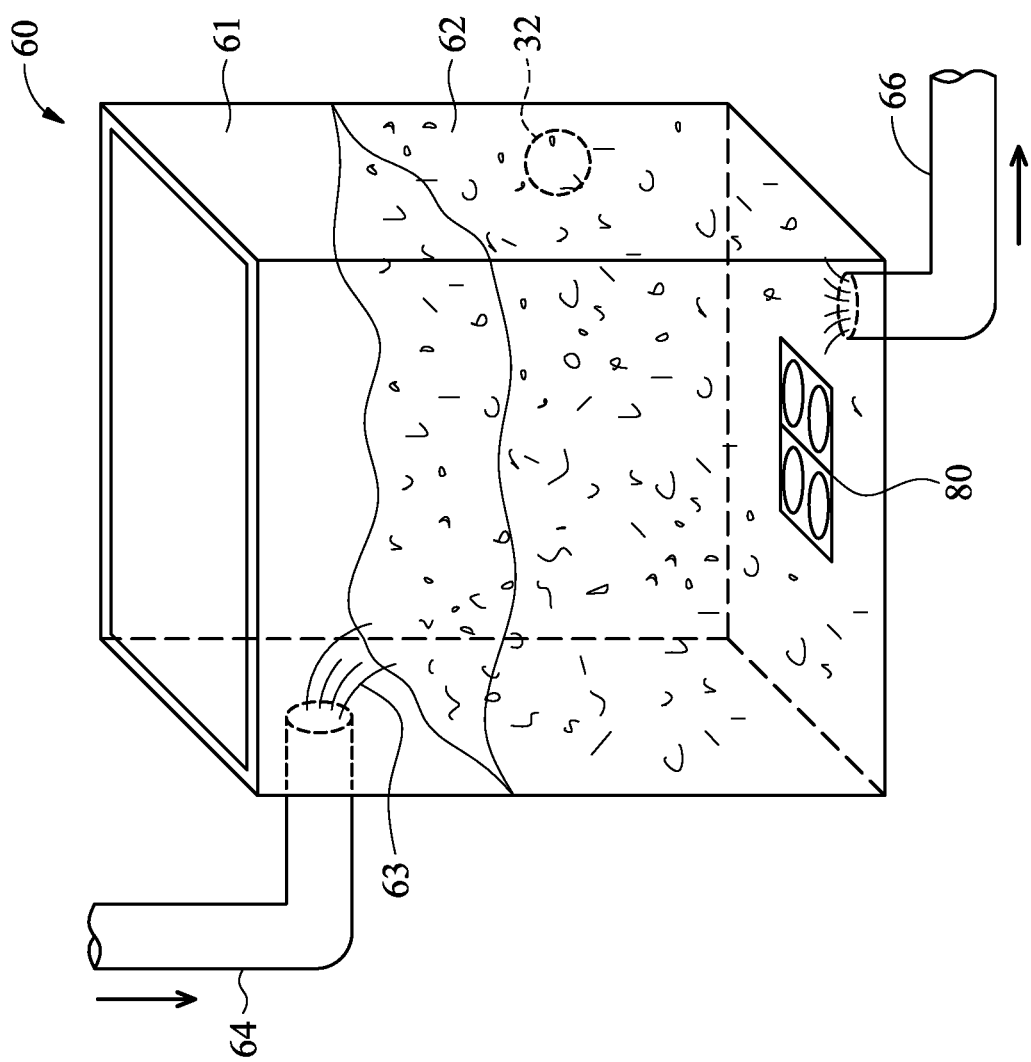
FIG. 5 illustrates a cleaning vessel used in a process of sonically cleaning a brush, in accordance with some embodiments.

FIGS. 5 through 10 illustrate various configurations for cleaning vessel 60 and describe certain processes accompanying the cleaning vessel 60, including processing cleaning liquid 62. FIG. 5 illustrates cleaning vessel 60 having fairly straight sidewalls. An inlet pipe 64 may be positioned to supply new cleaning liquid 63 to cleaning vessel 60. Although the inlet pipe 64 is illustrated as interfacing with a side wall of cleaning vessel 60, it will be appreciated that in some embodiments, inlet pipe 64 may enter a top of cleaning vessel 60. One end of the inlet pipe 64 may be connected to a source for the new cleaning liquid 63. The top of cleaning vessel 60 may be completely open or may be partially covered, allowing access for brush 50.

Transducer device 80 may be positioned within the cleaning vessel 60 for providing sonic waves to cleaning liquid 62. Transducer device 80 may be positioned on the bottom of cleaning vessel 60 or on sidewalls of cleaning vessel 60. In some embodiments multiple ones of transducer device 80 be used on cleaning vessel 60. In some embodiments, transducer device 80 may be centered to brush element 54. In some embodiments, transducer device 80 may be centered to any portion of brush element 54, such that the center of the transducer device 80 is aligned with a surface of brush element 54.

Figure 6B:
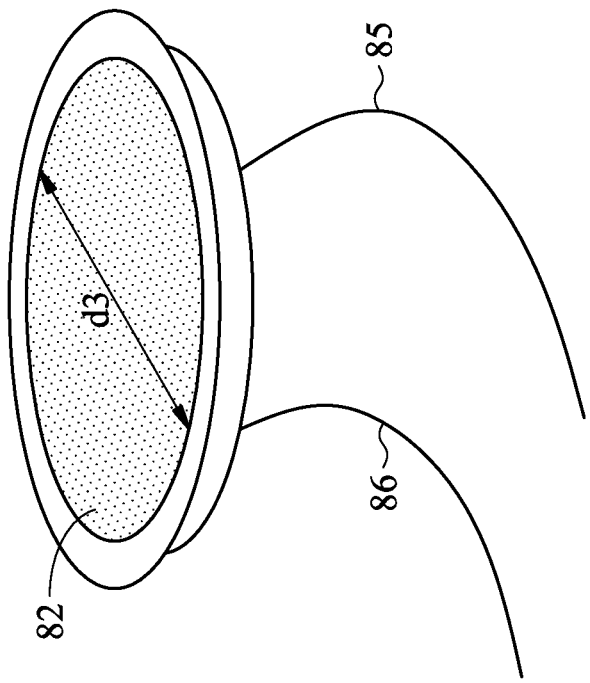
Figure 6A:
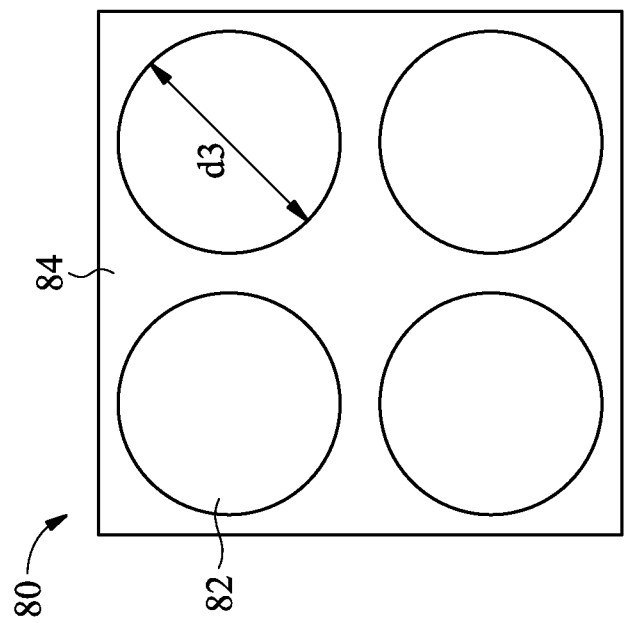

FIG. 6a illustrates transducer device 80, in accordance with some embodiments. One or more transducers 82 may be mounted to a substrate 84. The mounting surface of substrate 84 can be considered a major surface of transducer device 80. In some embodiments, transducer 82 may be mounted in an array configuration with other transducers 82, such as illustrated in FIG. 6a. Although four of transducers 82 are illustrated, any number of transducers 82 may be used in any suitable configuration depending on their selection and sizes. Transducer 82 may be a piezo-electric or other suitable transducer. In some embodiments, transducer 82 may be any type of vibration motor capable of producing a sonic wave in a desired frequency range to suitably clean brush 50. Transducer 82 may have a diameter d3 between about 10 mm and 30 mm, such as about 15 mm. In some embodiments, a ratio of the total square area of the transducers 82 in transducer device 80 to the square area of the cleaning surface of brush element 54 may be about 0.5:1 to about 4:1. In some embodiments, transducer device 80 may have an axis of vibration which is perpendicular to substrate 84 of transducer device 80. In some embodiments, transducer device 80 may not include a separate substrate 84, and may consist essentially of a single transducer 82.

FIG. 6b illustrates a transducer 82 from transducer device 80. When power is supplied to one lead 85 and a return path provided to the other lead 86, transducer 82 will vibrate. The frequency of vibration and intensity of the vibration may be configured by adjusting the voltage supplied to the transducer 82 and current supplied to the transducer 82. In some embodiments, a voltage of 1 V to about 5 V, such as about 4 V, may be used at a supplied current of about 100 mA to about 500 mA, such as about 200 mA. Other voltages and currents may be used, depending on the transducer 82 design and selection. Transducer 82 has an axis of vibration perpendicular to the surface of 82.

FIG. 6c illustrates a transducer device 80, as representative of some embodiments. In some embodiments, transducers 82 may be arranged in a circular pattern on a substrate 84 in top down view. Other arrangements may be used, including other shapes of substrate 84.

Turning back to FIG. 5, in some embodiments, transducer device 80 may be positioned in tank 61 such that its axis of vibration intersects with brush element 54. In such embodiments, transducer device 80 may be positioned in tank 61 such that it is at an angle to brush element 54. In other words, transducer device 80 can be positioned such its axis of vibration is neither parallel nor perpendicular to the cleaning surface of brush element 54.

Still referring to FIG. 5, particles 32 from brush 50 are in cleaning liquid 62 resulting from the sonic cleaning of brush 50. The contaminated cleaning liquid 62 may be drained through outlet pipe 66. Although the outlet pipe 66 is illustrated as interfacing with a bottom surface of cleaning vessel 60, it will be appreciated that in some embodiments, outlet pipe 66 may interface with a side wall of tank 61. In some embodiments, outlet pipe 66 may be a dip tube coming from the top of the cleaning vessel.

In some embodiments, cleaning liquid 62 of cleaning vessel 60 may be constantly drained and replenished. For example, a slow flow of new cleaning liquid 63 may be supplied by inlet pipe 64 and an equal slow flow of contaminated cleaning liquid 62 may be drained by outlet pipe 66. For example, a flow rate of the drain of contaminated cleaning liquid 62 may be between about 100 to 2000 ml/min, such as about 500 ml/min. Similarly, a flow rate of the new cleaning liquid 63 from inlet pipe 64 may be between about 10 to 100 ml/min, such as about 80 ml/min. Other suitable flow rates may be used as desired. In some embodiments, the inlet flow rate may be about the same as the drain flow rate. In some embodiments, cleaning vessel 60 may be periodically emptied of contaminated cleaning liquid 62 and refilled. In some embodiments, a combination of techniques can be used, including constant draining and replenishment of the cleaning liquid 62 and a periodic flush and fill of the contaminated cleaning liquid 62.

The particles 32 in cleaning liquid 62 may be denser than the surrounding cleaning liquid 62 and settle toward the bottom of cleaning vessel 60. The settled particles 32 can exit from cleaning vessel 60 by outlet pipe 66. In some embodiments, outlet pipe 66 may lead to a processing device to separate the particles 32 from the cleaning liquid 62 to reuse the cleaning liquid 62. In some embodiments, the contaminated cleaning liquid 62 may be discarded. The bottom surface of cleaning vessel 60 may have a sloped portion in some embodiments, directing the contaminated cleaning liquid 62 toward outlet pipe 66.

In some embodiments, cleaning liquid 44 sprayed on wafer 30 in the wafer cleaning process may be the same as cleaning liquid 62 used in cleaning vessel 60. In other embodiments, however, cleaning liquid 44 may be different than cleaning liquid 62. In such embodiments, a concentration of cleaning liquid 44 may be found in cleaning liquid 62. When particles 32 are cleaned off of brush 50, some of cleaning liquid 44 is transferred to tank 61 containing cleaning liquid 62. A ratio of cleaning liquid 44 to cleaning liquid 62 may be between about 0.01 and 0.2, such as about 0.1.

Figure 7:
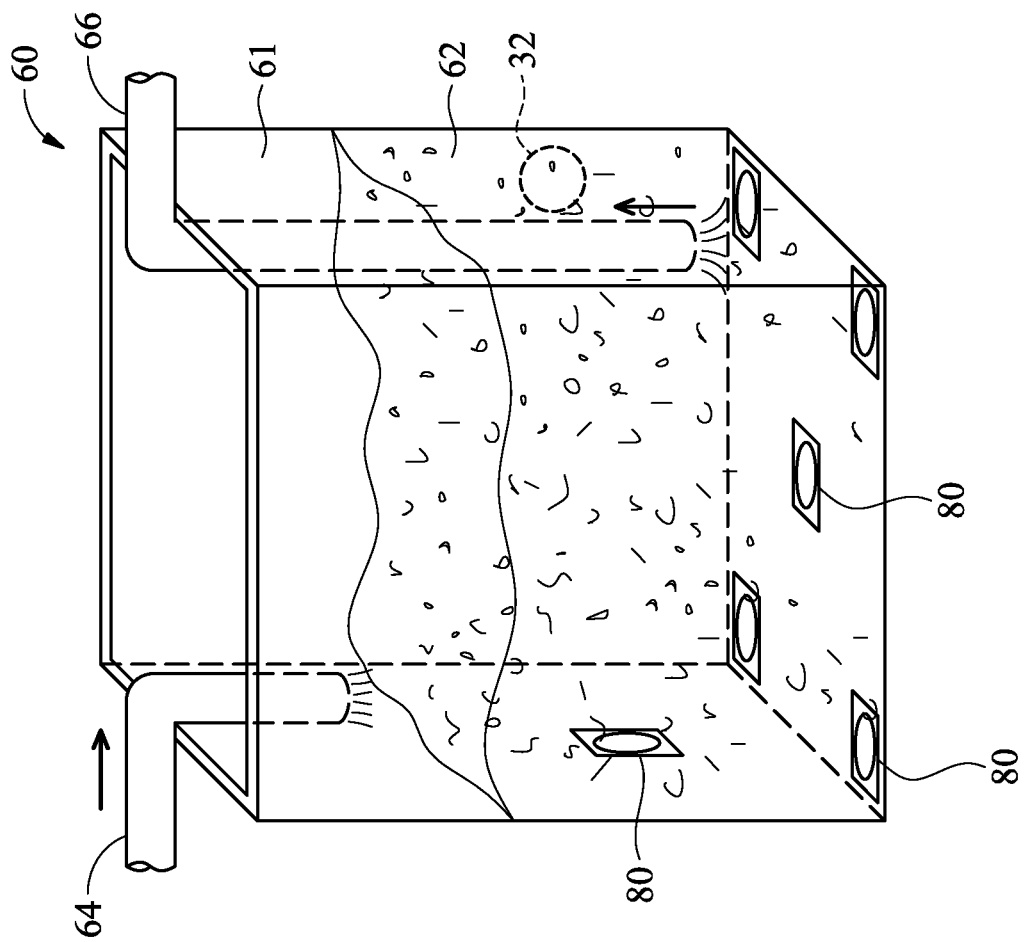
FIGS. 7 through 10 illustrate various arrangements of cleaning vessels used in a process of sonically cleaning a brush, in accordance with some embodiments.

FIG. 7 illustrates a cleaning vessel 60 in accordance with some embodiments. FIG. 7 illustrates different configurations for some of the elements of cleaning vessel 60. These elements can be configured, for example, as described above with respect to FIG. 5, or one or more of these elements can be configured such as illustrated in FIG. 7. Inlet pipe 64 is configured to dispense cleaning liquid 62 from the top of the cleaning vessel 60. Outlet pipe 66 is illustrated as a dip tube, which is configured to suck contaminated cleaning liquid 62 from the bottom of cleaning vessel 60 where particles 32 may settle. One or more transducer devices 80 are illustrated as being in multiple separate locations in cleaning vessel 60. Any combination of these configurations may be used. Other embodiments can use other configurations not pictured or specifically discussed herein, but which have similar functions.

Figure 8:
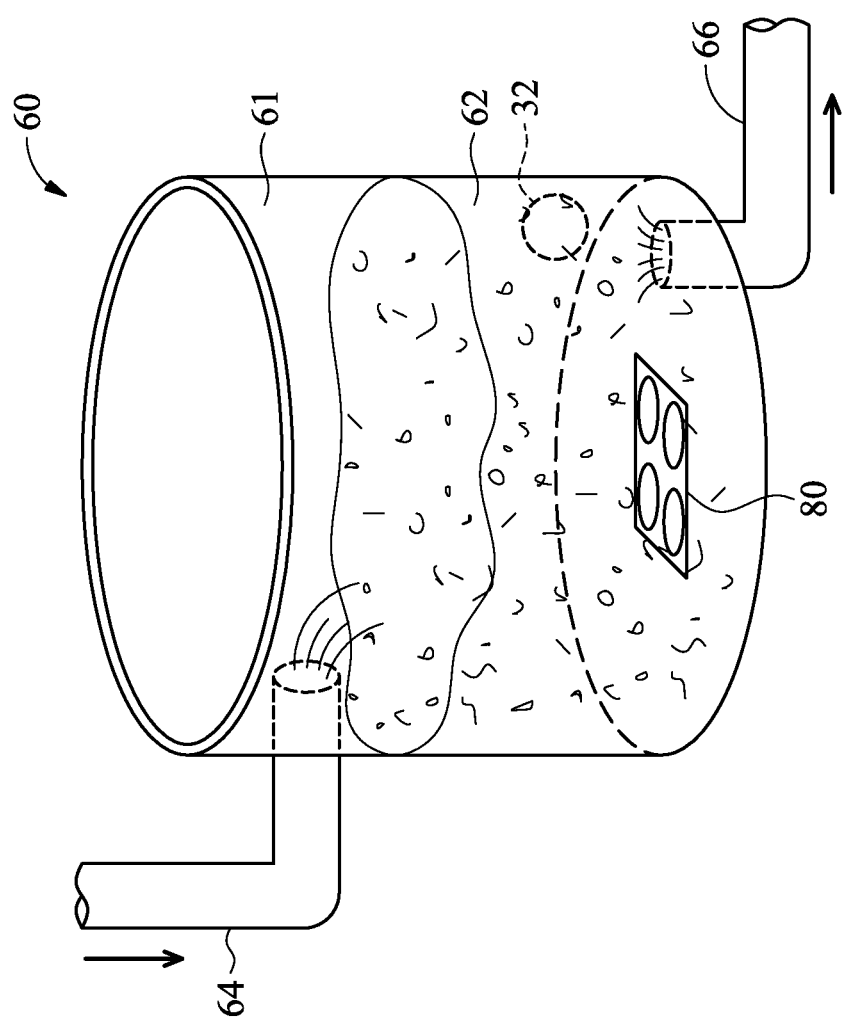
Figure 9:
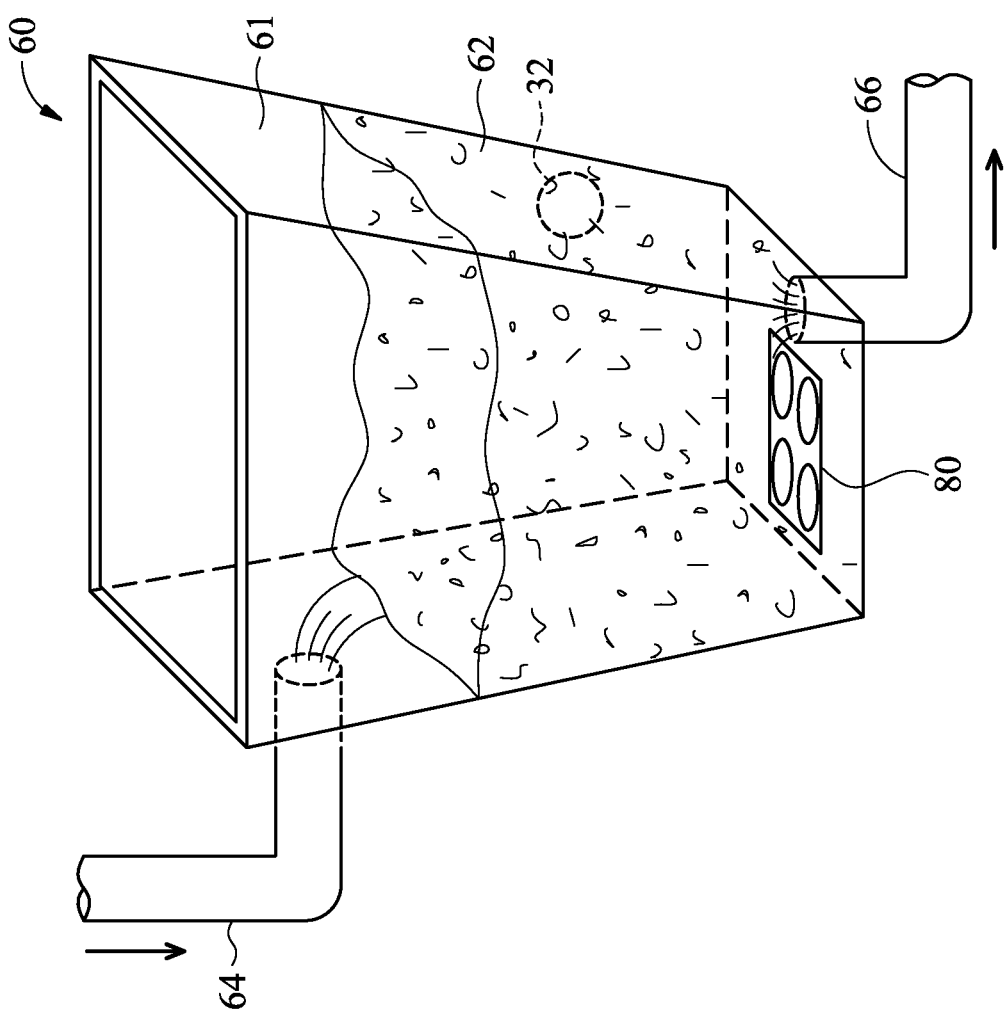
Figure 10:
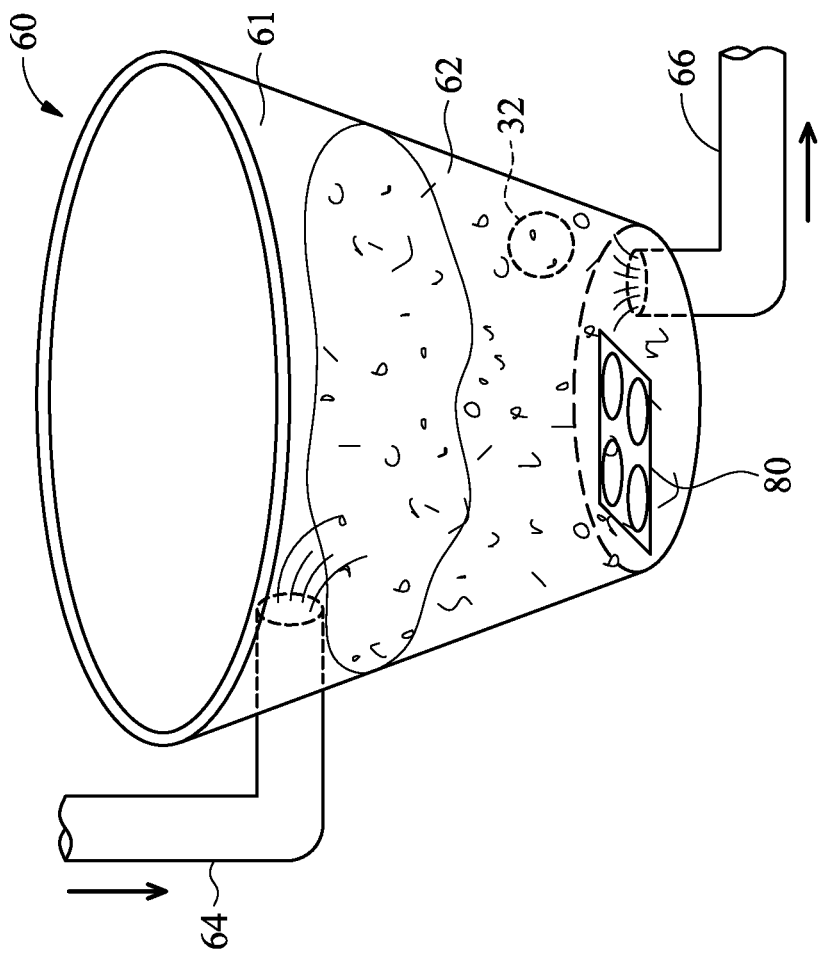

FIGS. 8 through 10 illustrate different configurations for cleaning vessel 60. While cleaning vessel 60 as illustrated in FIG. 5 resembles a rectangular prism, cleaning vessel 60 illustrated in FIG. 8 is cylindrical. Cleaning vessel 60 illustrated in FIG. 9 is an inverted pyramid, tapering narrower at the bottom. A tapered design may be beneficial as further directing particles 32 in contaminated cleaning liquid 62 to outlet pipe 66. FIG. 10 illustrates a conical shaped cleaning vessel 60 which may have a similar benefit as the pyramid shape in FIG. 9, since it may be more efficient to remove the particles 32 from cleaning liquid 62. The different shaped cleaning vessels in FIGS. 8 through 10 can also be combined with the different configurations for the elements discussed above in conjunction with FIG. 7.

Figure 11:
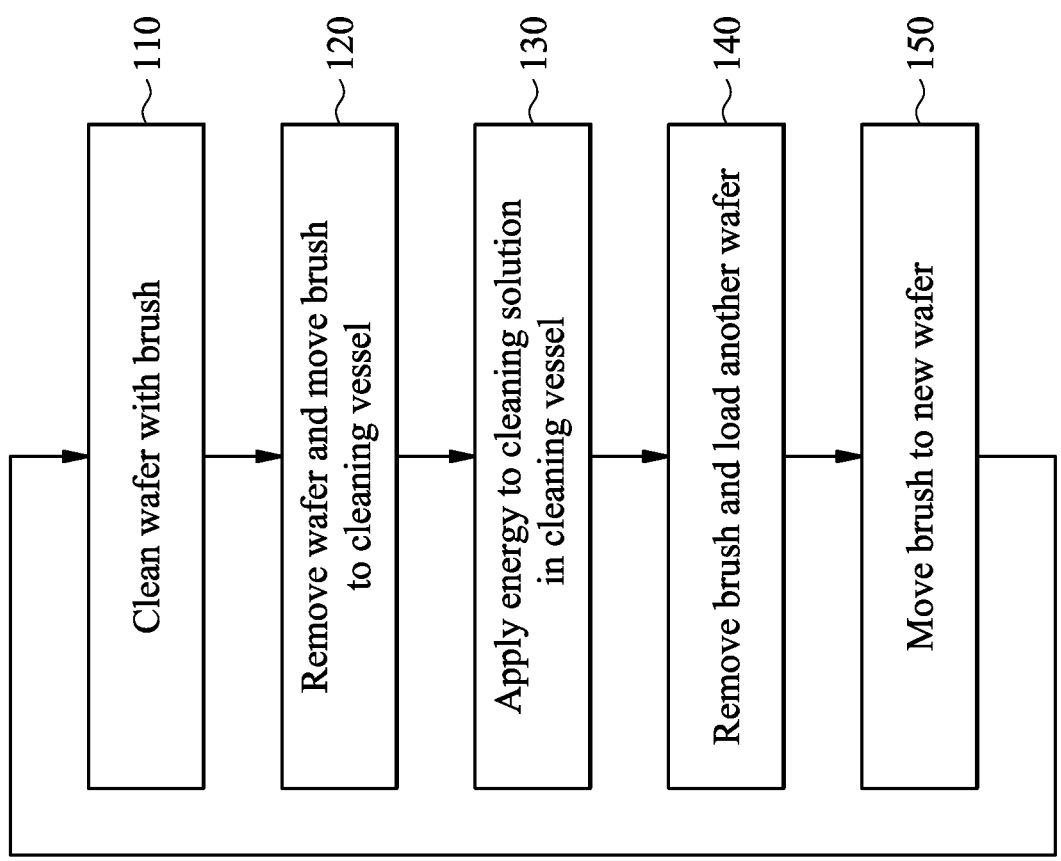
FIG. 11 is a flow diagram of a process of sonically cleaning a brush, in accordance with some embodiments.

FIG. 11 illustrates a wafer cleaning process in accordance with some embodiments. At step 110, a wafer, such as wafer 30, is cleaned with a brush, such as brush 50. While the wafer is being cleaned, the wafer may be sprayed with a cleaning liquid, such as cleaning liquid 44. After the wafer is cleaned, at step 120, the wafer will be removed from the cleaning system and at the same time the brush will be moved to a cleaning vessel configured to clean the brush. As the wafer is being removed and next wafer is being loaded, at step 130, energy will be supplied to cleaning liquid in the cleaning vessel by way of a sonic wave, such as an ultrasonic or megasonic wave.

After the brush has been cleaned, while the next wafer to process is being loaded into the cleaning system, at step 140, the brush will be removed from the cleaning liquid and, at step 150, returned to a ready position to process a newly loaded wafer. In some embodiments, the timing of the brush cleaning and wafer unloading/loading may be synchronized so that the brush cleaning does not add any additional time to the wafer cleaning processing of the cleaning system.

Embodiments provide for a brush to be cleaned using a sonic cleaning process, such as an ultrasonic or megasonic cleaning process, to produce cavitation in the cleaning liquid in which the brush is submerged. The cleaning process removes contaminants from the brush head, such as particle by-products which have been cleaned off of wafers with the brush. The contaminants fall into the tank and are flushed out of the tank when contaminated cleaning liquid is removed from the tank. Cleaning the brush provides a better overall wafer cleaning process because there is less cross-contamination that occurs from one wafer to the next. In addition, cleaning the brush provides for an increased longevity of the brush element.

One embodiment is a method which includes cleaning a wafer with a brush element, where the brush element collects particles from the wafer cleaning. The brush element is immersed in a first cleaning liquid. A sonic vibration is applied to the first cleaning liquid, dislodging the particles from the brush element into the first cleaning liquid by the sonic vibration, the particles contaminating the first cleaning liquid.

Another embodiment is a method that includes providing a cleaning vessel adjacent to a wafer cleaning station, providing a supply line to the cleaning vessel, providing a drain line from the cleaning vessel, and providing a transducer element in the cleaning vessel. The supply line is configured to provide a first cleaning liquid to the cleaning vessel. The drain line is configured to remove contaminated first cleaning liquid from the cleaning vessel. The transducer element is positioned in the cleaning vessel so as to be submerged in the first cleaning liquid. A portion of the cleaning vessel is filled with the first cleaning liquid and a brush cleaning head is submerged in the first cleaning liquid. The transducer element is activated at a first frequency causing cavitation of the first cleaning liquid at the brush cleaning head.

Another embodiment is system for cleaning a wafer, including a wafer cleaning station. The wafer cleaning station includes a spray head, configured to spray a first cleaning liquid on a wafer, a wafer support platform, and a cleaning brush. The system also includes a cleaning vessel. The cleaning vessel includes a tank, an inlet pipe, configured to supply a second cleaning liquid to the tank, an outlet pipe, configured to drain contaminated second cleaning liquid from the tank, and a transducer, configured to vibrate at a first frequency when energized. The wafer cleaning station is configured to move the cleaning brush to the tank and to energize the transducer when the cleaning brush is in the tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   cleaning a wafer with a brush element, the brush element having a vertical orientation perpendicular to a major surface of the wafer, the brush element collecting particles from the wafer cleaning, the brush element moving in a sweeping arc across the wafer by a robotic arm;
   immersing the brush element in a first cleaning liquid in a cleaning vessel, sidewalls of the cleaning vessel being nonparallel to each other, the sidewalls tapering from an opening at a top of the cleaning vessel to a bottom of the cleaning vessel so that the top of the cleaning vessel is larger than the bottom of the cleaning vessel;
   applying a sonic vibration to the first cleaning liquid from a first transducer disposed at a side of the cleaning vessel and from a set of transducers disposed at a bottom of the cleaning vessel at four corners of the cleaning vessel, the sonic vibration dislodging particles from the brush element and contaminating the first cleaning liquid with the particles; and
   sucking contaminated cleaning liquid from the bottom of the cleaning vessel by a dip tube.

2. The method of claim 1, further comprising:
   actuating the robotic arm to rotate the brush element from the wafer to the cleaning vessel positioned in a path of the sweeping arc;
   after actuating the robotic arm and while immersing the brush element and applying the sonic vibration, unloading the cleaned wafer;
   loading a dirty wafer; and
   returning the brush element to clean the dirty wafer, wherein a first total time for actuating the robotic arm, immersing the brush element, applying the sonic vibration, and returning the brush element is no longer than a second total time of unloading the cleaned wafer and loading the dirty wafer.

3. The method of claim 1, wherein the first transducer is further disposed within the first cleaning liquid, wherein the first transducer has an axis of vibration which intersects the brush element, wherein the brush element is oriented along a first axis, the first axis parallel to the brush element, and wherein the axis of vibration is neither perpendicular nor parallel to the first axis.

4. The method of claim 1, further comprising:
supplying replacement cleaning liquid to the cleaning vessel.

5. The method of claim 4, further comprising:
removing contaminated cleaning liquid from the cleaning vessel, wherein a portion of the bottom of the cleaning vessel is sloped toward an outlet of the cleaning vessel.

6. The method of claim 4, wherein supplying the replacement cleaning liquid and sucking the contaminated cleaning liquid are accomplished without penetrating sidewalls of the cleaning vessel.

7. The method of claim 1, wherein prior to immersing the brush element, the brush element includes contaminants disposed on a first surface area of the brush element, wherein activating the plurality of transducer elements causes 90% to 99% of the contaminants to dislodge from the first surface area of the brush element and become dispersed in a volume of the first cleaning liquid, a temperature of the first cleaning liquid being between about 55° C. and 80° C.

8. A method, comprising:
providing a cleaning vessel adjacent to a wafer cleaning station, the cleaning vessel comprising a plurality of transducer elements, the plurality of transducer elements mounted together on a single substrate in a circular arrangement;
providing a supply line to the cleaning vessel;
providing a drain line from the cleaning vessel, the drain line comprising a dip tube entering the cleaning vessel at a top of the cleaning vessel, an inlet for the dip tube located at a bottom of the cleaning vessel;
filling a portion of the cleaning vessel with a first cleaning liquid;
submerging a brush cleaning head in the first cleaning liquid, the brush cleaning head having a first surface area;
activating the plurality of transducer elements at a first frequency causing a cleaning of the brush cleaning head, the plurality of transducer elements having a second surface area comprising a total combined surface area of each of the plurality of transducer elements; and
draining the first cleaning liquid from the bottom of the cleaning vessel by suctioning the first cleaning liquid by the dip tube.

9. The method of claim 8, further comprising:
supplying the first cleaning liquid to the cleaning vessel by the supply line at a first rate, wherein draining the first cleaning liquid by the drain line is at a second rate, wherein the first rate and the second rate are equal.

10. The method of claim 9, further comprising:
while draining the first cleaning liquid, supplying the first cleaning liquid to the cleaning vessel by the supply line to a top of the cleaning vessel without penetrating a side of the cleaning vessel, an outlet of the supply line disposed above a surface of the first cleaning liquid.

11. The method of claim 10, wherein a bottom surface of the tank has a sloped portion configured to direct contaminated cleaning liquid toward the inlet of the dip tube while draining the first cleaning liquid.

12. The method of claim 8, wherein the plurality of transducer elements are submerged within the first cleaning liquid, further comprising a second plurality of transducer elements, the second plurality of transducer elements disposed at four bottom corners of the cleaning vessel, the second plurality of transducer elements mounted so that a major surface of each of the second plurality of transducer elements is parallel to a bottom of the cleaning vessel.

13. The method of claim 8, further comprising:
cleaning a wafer with the brush cleaning head; and
while the brush cleaning head is cleaning the wafer, spraying the brush cleaning head directly with a second cleaning liquid, the brush cleaning head positioned vertically over the wafer during spraying the brush cleaning head.

14. The method of claim 8, wherein a ratio of a volume of the first cleaning liquid in the cleaning vessel to the first surface area is between about 230 cm and about 300 cm.

15. The method of claim 14, wherein prior to submerging the brush cleaning head, the brush cleaning head includes contaminants disposed on the first surface area, wherein applying the sonic vibration causes 90% to 99% of the contaminants to dislodge from the first surface area of the brush cleaning head and become dispersed in the volume of the first cleaning liquid.

16. The method of claim 15, further comprising: heating the first cleaning liquid to a temperature between 55° C. and 80° C.

17. A system for cleaning a wafer, comprising:
a wafer cleaning station, comprising:
a spray head, configured to spray a first cleaning liquid on a wafer,
a wafer support platform, and
a cleaning brush, the cleaning brush configured to be positioned in a vertical orientation with respect to the wafer support platform; and
a cleaning vessel, comprising:
a tank,
an inlet pipe, configured to supply a second cleaning liquid to the tank,
an outlet pipe, configured to drain contaminated second cleaning liquid from the tank, a bottom surface of the tank having a sloped portion configured to direct contaminated cleaning liquid toward the outlet pipe, the outlet pipe comprising a dip tube entering the cleaning vessel from a top of the cleaning vessel and having a suction inlet disposed at a bottom of the cleaning vessel, and
a first transducer disposed at a bottom surface of the tank configured to be within the second cleaning liquid, configured to vibrate at a first frequency when energized,
a second transducer disposed at a sidewall surface of the tank, configured to vibrate at a second frequency when energized,
a set of third transducers disposed at corners of the tank, configured to vibrate at a third frequency when energized,
wherein the wafer cleaning station is configured to move the cleaning brush to the tank, and submerge the cleaning brush in the second cleaning liquid, wherein the cleaning vessel is configured to energize the first transducer, the second transducer, and the set of third transducers when the cleaning brush is in the tank and submerged in the second cleaning liquid, the first transducer and the second transducer each vibrating a volume of the second cleaning liquid in the tank.

18. The system of claim 17, wherein the set of third transducers is mounted parallel to the bottom surface of the tank, wherein an opening for the outlet pipe is disposed between the first transducer and a first side wall of the tank, the first transducer being located off center the bottom surface to accommodate the opening for the outlet pipe, the first transducer located closer to a second side wall of the tank opposite the first side wall.

19. The system of claim 17, wherein a ratio of a volume of the tank to a surface area of a cleaning surface of the cleaning brush is between about 285 cm and about 375 cm.

20. The system of claim 17, wherein the tank of the cleaning vessel is free from sidewall penetrations.

* * * * *